(12) United States Patent
Adler et al.

(10) Patent No.: US 6,781,398 B2
(45) Date of Patent: Aug. 24, 2004

(54) CIRCUIT FOR TESTING AN INTEGRATED CIRCUIT

(75) Inventors: Frank Adler, Munich (DE); Hartmut Berger, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/208,252

(22) Filed: Jul. 30, 2002

(65) Prior Publication Data

US 2003/0035400 A1 Feb. 20, 2003

(30) Foreign Application Priority Data

Jul. 31, 2001 (DE) .......................................... 101 37 345

(51) Int. Cl.[7] .............................................. G01R 31/26
(52) U.S. Cl. .................................... 324/765; 324/158.1
(58) Field of Search .............................. 324/765, 158.1, 324/73.1, 763, 768, 769

(56) References Cited

U.S. PATENT DOCUMENTS 5,070,297 A * 12/1991 Kwon et al. ................. 324/754
5,107,205 A * 4/1992 Ebihara ....................... 714/740
6,549,150 B1 * 4/2003 Bulaga et al. ............... 341/120

FOREIGN PATENT DOCUMENTS

WO   WO 00/34797   6/2000

* cited by examiner

Primary Examiner—Kamand Cuneo
Assistant Examiner—Tung X. Nguyen
(74) Attorney, Agent, or Firm—Fish & Richardson P.C.

(57) ABSTRACT

A test circuit for testing an integrated circuit, includes a test signal input for receiving a test signal from the integrated circuit and a reference signal input for receiving a reference signal. A comparator is in communication with the test signal input and with the reference signal input. The comparator is configured to provide, at a comparator output, an error signal if a comparison between the reference signal and the test signal indicates an error. The error signal, if present, is stored in an error memory, in communication with the comparator output.

17 Claims, 2 Drawing Sheets

CIRCUIT FOR TESTING AN INTEGRATED CIRCUIT

FIELD OF INVENTION

The invention relates to a circuit apparatus for testing at least one test signal output by an integrated circuit.

RELATED APPLICATIONS

This application claims the benefit of the Jul. 31, 2001 filing date of German application 101 37 345.7-53, the contents of which are herein incorporated by reference.

BACKGROUND

Integrated circuits undergo a multiplicity of different test methods during and after their fabrication process. With the continually growing complexity of modern integrated circuits—in particular DRAM memories—the required test methods also become more complex and require ever more powerful test systems. Since the typical product lifetime, in particular of modern memory components, often amounts to only a few months, it is impracticable for cost reasons to individually create anew a test system suitable for a specific memory component. Therefore, modern test systems for the functional testing of complex integrated circuits are usually individually programmable within wide limits, in order to be able to be adapted to ever new DUTs (device under test). Therefore, the test systems used in the semiconductor memory industry, some of which have procurement prices of in excess of one million Euros, can typically be used over a plurality of product generations.

A critical bottleneck of commercial test systems for integrated circuits, for example of the Advantest T 5581 test system for DRAM-DIMMS, is the number of freely programmable and fast input/output terminals (I/O pins). By way of example, the Advantest T 5581 D-type test system, for parallel test purposes, has over n*72 fast, freely programmable I/O pins (n=4, 8 or 16) which suffice for complete functional testing of an SDR-DIMM (single data rate DIMM) with high parallelism and flexibility (in particular owing to the scrambling of the PCB (printed circuit board) that is to be taken into account). DDR-DIMMs (double data rate DIMMs), which are increasingly being used, have a further 18 terminals, however, on account of the DQS signals (data query strobe) arising in this case, so that flexible and highly parallel functional testing of, in particular, the DQS signals during the read operation is problematic with this test system.

Therefore, performance boards (base boards or HiFix boards) have conventionally had to be used, on which DDR-DIMMs have been able to be tested only 4-fold in parallel with low flexibility.

SUMMARY

In view of the above disadvantages, it is an object of the invention, therefore, to extend in particular conventional test systems, whose number of freely programmable fast I/O pins (i.e. the number of comparators) does not suffice for a flexible and complete functional test of an integrated circuit, in a simple and cost-effective manner for the new test task.

According to the invention, a circuit apparatus for testing at least one test signal output by an integrated circuit comprises at least one test signal input for the signal inputting of the test signal;

at least one reference signal input for the signal inputting of a reference signal;

at least one comparator device, which is designed for a signal comparison of the test signal with the reference signal and for outputting an error signal if the signal comparison yields an error;

at least one error memory device for storing the error signal; and at least one error signal output connected to the error memory device.

According to the invention, a circuit apparatus is used which has inputs for the signal to be tested (e.g. the DQS signal of DDR-DIMM) and for a reference signal chosen in accordance with the corresponding specification. The test signal is input into the test signal input from the integrated circuit to be tested.

The reference signal can be output by an external test system. It is advantageous that there is no need to use a "valuable" fast I/O pin of the test system in order to output the reference signal to the circuit apparatus. Instead of this, a so-called driver output of the test system may preferably be used, which driver output, although designed for fast and freely programmable signal outputting, is not designed for signal inputting. Although it is often the case in test systems which are used for highly complex test tasks that all the fast I/O pins which can compare signals output by the integrated circuit to be tested with reference signals are occupied, so that additional signals of the integrated circuit cannot be directly tested at the same time, such test systems nonetheless typically also have a multiplicity of additional driver outputs which are not yet occupied.

The circuit apparatus according to the invention enables these hitherto unutilized driver outputs of the test system to be preferably used to test the additional (test) signals of the integrated circuit to be tested. The test signal is compared with the reference signal (from the driver output of the test system) in the comparator device of the circuit apparatus. If the signal comparison turns out to be negative, i.e. the test signal does not satisfy the test reference prescribed by the reference signal, the comparator device generates an error signal which is stored in an error memory device. The error memory device can be read externally via the error signal output in particular by the external test system.

Although a signal input of the test system is required for the read-out operation of the error memory device, this test result input of the test system need not be a "fast" signal input, since the error state stored in the error memory device can also be read out with a read-out rate which is significantly lower than the signal rate of the test and reference signals. Such "slow" programmable signal inputs of the test system are often still available even when all the "fast" inputs are already occupied.

Consequently, the circuit device enables the functional testing of an additional signal output of the integrated circuit (i.e. of the test signal) without this requiring an additional fast I/O pin of the test system. Instead of this, the circuit apparatus according to the invention makes it possible to use a fast driver output and also a slow signal input of the test system.

It is particularly advantageous, moreover, that a single driver output of the test system can be connected to a multiplicity of reference signal inputs of the circuit apparatuses in order to test a multiplicity of DQS signals of a DDR-DIMM. In this case, a multiplicity of test signal inputs and comparator devices are correspondingly provided. The error evaluation can in this case be effected separately for each test signal (i.e. DQS-fine error testing) if each comparator device is assigned an error memory device. It is often sufficient, however, for the error evaluation merely to be of DUT-fine design, so that, in particular, a single error memory device per DUT may be sufficient.

Preferably, the comparator device is designed for a voltage comparison of the test signal with the reference signal and for outputting a binary error signal. The voltage comparison may be performed by the comparator device in particular continuously or only when said comparator device is in a comparison mode which can be activated externally. It is advantageous to provide a binary signal as the error signal. In this case, the test result input of the test system, which input is connected to the error signal output of the circuit apparatus, need be, for example, only a simple (slow) TTL input.

Preferably, the error memory device comprises at least one flip-flop circuit. Preferably, the error memory device is connected to a reset signal input for erasing an error state of the error memory device. The reset signal can be generated by a programmable signal output of the test system, which output may be, in particular, slow and binary.

Preferably, the test signal input is connected to at least one first and one second comparator device and at least one first and one second reference signal input are provided, wherein
  the first comparator device is designed for outputting a first error signal if the voltage of the test signal is greater than the voltage of a first reference signal at the first reference signal input, and
  the second comparator device is designed for outputting a second error signal if the voltage of the test signal is less than the voltage of a second reference signal at the second reference signal input.

The first comparator device is designed for testing the HIGH signal state and the second comparator device is designed for testing the LOW signal state of the test signal.

Preferably, the first comparator device is connected to a first error memory device and the second comparator device is connected to a second error memory device, and the error memory devices can be read separately from one another via the error signal output.

If the intention is to carry out separate error evaluation according to HIGH and LOW errors, each comparator device is connected to a separate error memory device. These error memory devices can be connected to a single error signal output if additional error memory selection inputs (output enable) are provided. Otherwise, it is also possible to use a single error memory device for both comparator devices if HIGH error states do not have to be discriminated from LOW error states.

The invention furthermore proposes an arrangement of a test system for integrated circuits having a circuit apparatus according to the invention, wherein the test system comprises:
  at least one programmable driver output for outputting a voltage signal, which is connected to the reference signal input of the circuit apparatus, and
  at least one test result input, which is connected to the error signal output of the circuit apparatus.

As already described in detail above, such an arrangement of an, in particular, conventional test system with the circuit arrangement enables functional testing of an output signal of an integrated circuit without a further fast I/O pin of the test system having to be occupied for this purpose. Instead of this, the test signal can be tested by the arrangement if the test system has an as yet unoccupied driver output and also an, in particular, slow signal input (test result input).

In particular, the test system is an Advantest T 5581 (preferably D-type) and the circuit apparatus is an ASIC or a programmable logic device (PLD). The circuit apparatus is preferably integrated into a performance board (base board, HiFix board) of the test system in the form of an ASIC. The arrangement according to the invention is advantageously suitable for testing DDR-DIMMs with 18 additional DQS signal outputs relative to SDR-DIMMs for complete functioning of all signal outputs with high parallelism and flexibility. This is not possible without the circuit apparatus.

Preferably, the driver output is an analogue high-speed output and the test result input is a low-speed input of the test system. In this case, a high-speed output is understood to be a signal output which is designed for signal rates of the order of magnitude of the system clock of the integrated circuit. The "speed" of the test result input may be orders of magnitude lower than this.

Preferably, the test system comprises at least one first and one second programmable driver output for outputting voltage signals, and the first driver output is connected to the first reference signal input and the second driver output is connected to the second reference signal input, a reference voltage vREF also sufficing given a suitable termination.

Preferably, the test system has at least one further programmable driver output, which is connected to the test signal input. This further driver output which is connected to the test signal input may advantageously be used for functional testing and calibration of the arrangement. In particular, a precisely defined signal can be output by the test system via the further driver output into the test signal input of the circuit apparatus in order to simulate an actual test signal. Since the time and/or voltage behavior of this simulated test signal is known precisely, it is possible to check whether the circuit apparatus is working properly.

Since, moreover, a possible propagation time difference between the actual test signal from the integrated circuit to the test signal input and the simulated test signal from the test system to the test signal input is known, the further driver output can be used for time calibration of the arrangement. The time behavior of the reference signal output by the test system can be exactly adapted in this way.

Preferably, the further driver output is connected to the test signal input in such a way that it forms an active termination of the test signal input.

Particular preference is attached to a use of the arrangement according to the invention for testing at least one DQS signal of a DDR-DIMM, in particular in conjunction with the Advantest T 5581 D-type test system.

According to the invention, a method for testing at least one test signal output by an integrated circuit, having the following steps:
  inputting of the test signal from the integrated circuit into a test signal input of a circuit apparatus;
  inputting of a reference signal from a test system into a reference signal input of the circuit apparatus;
  comparison of the test signal with the reference signal by a comparator device of the circuit apparatus;
  outputting of an error signal into an error memory device of the circuit apparatus if the signal comparison yields an error; and
  read-out of the error signal from the error memory device by the test system.

The circuit apparatus is preferably a circuit apparatus according to the invention as described above. It may be provided that the comparator device carries out the signal comparison only in a comparison mode which can be activated externally.

The invention is described by way of example below with reference to accompanying drawings of a preferred embodiment. In the figures:

DETAILED DESCRIPTION

Figure 1:
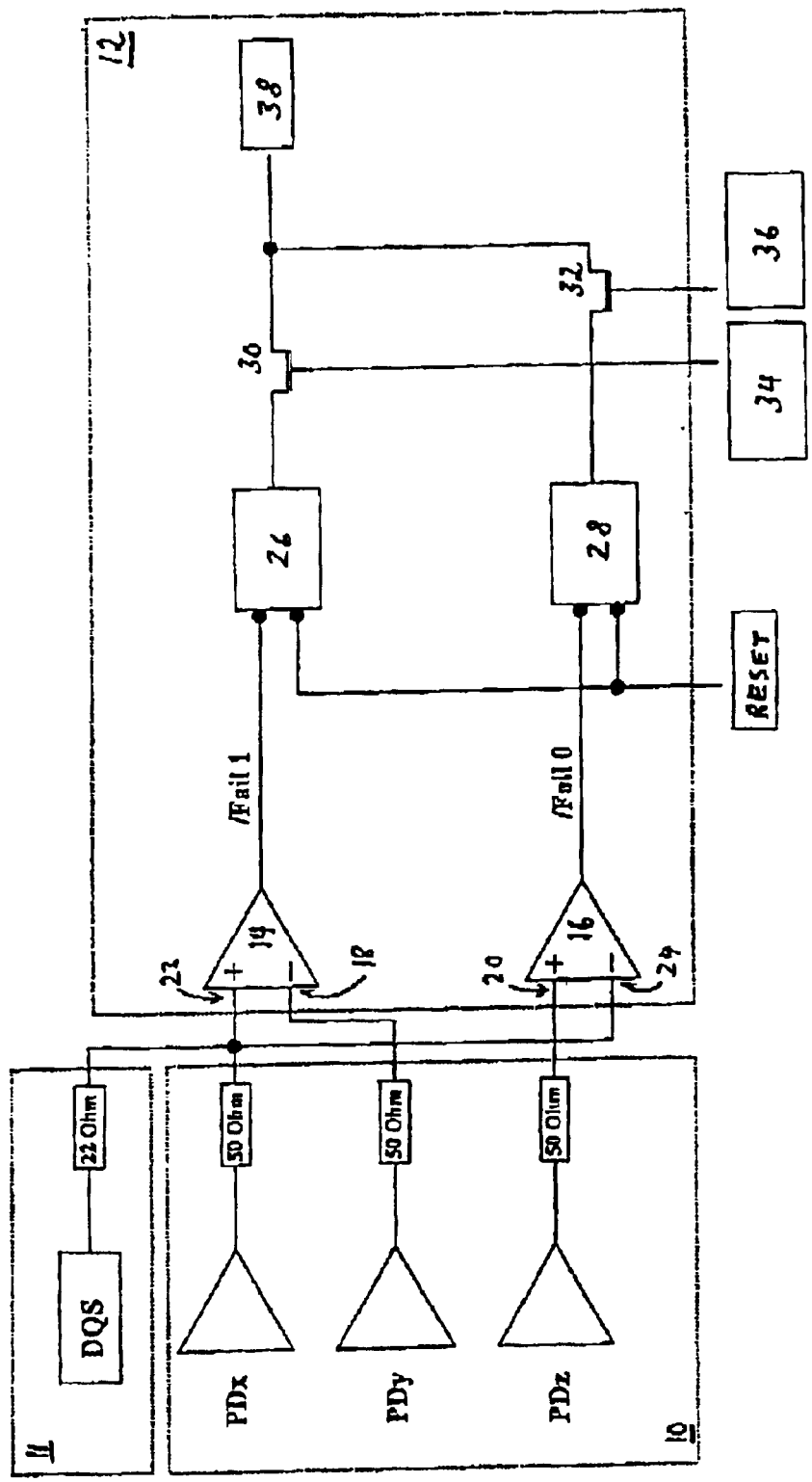
FIG. 1 shows a schematic circuit diagram of an embodiment of an arrangement according to the invention.

FIG. 1 illustrates a preferred embodiment of an arrangement according to the invention of a test system for integrated circuits with a circuit apparatus. The test system may be, for example, an Advantest T 5581 D which is used for testing DRAM memory modules. Only the driver outputs PDx, PDy and PDz of the test system 10 are illustrated in FIG. 1. The driver output PDy outputs a reference signal into a reference signal input 18 (negative comparator input) of a comparator device 14 of the circuit apparatus 12, which is likewise designated by PDy for simplification. The comparator device 14 is a first comparator device designed for testing the HIGH signal state of a test signal DQS of the integrated circuit 11.

In a similar manner, the driver output PDz is connected to a reference signal input 20 (positive comparator input) of a second comparator device 16 of the circuit apparatus 12. The comparator device 16 is designed for testing the LOW signal state of the test signal DQS.

The test signal DQS, which is output by the integrated circuit 11, is input into the test signal inputs 22 and 24 of the comparator devices 14 and 16, respectively. The test signal inputs 22 and 24 are connected to a further driver output PDx of the test system 10, whereby these are actively terminated. Furthermore, the driver output PDx enables a self-calibration of the arrangement (see below) and generates the DQS signal during the writing of data to the DDR-DIMM.

Figure 2:
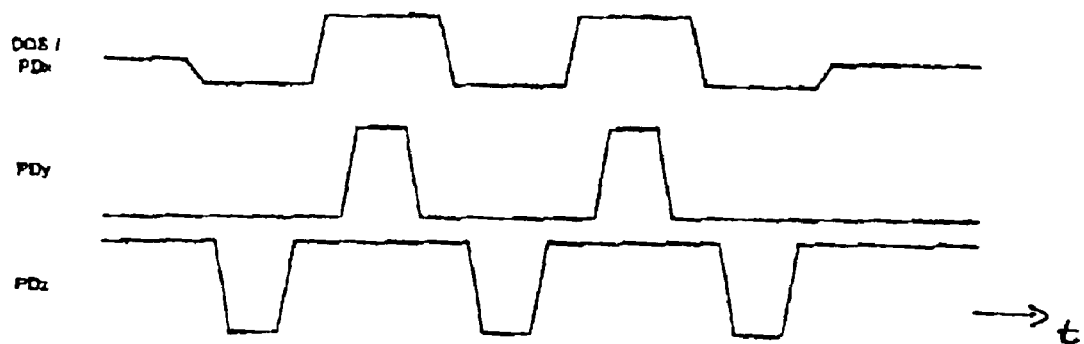
FIG. 2 shows a timing diagram of the test signal (DQS) and of the reference signal (PDy, PDz) in the case of a test method with the arrangement of FIG. 1.

The method of operation of the embodiment of the arrangement according to the invention is described below with reference to FIG. 1 and the signal profile of the signals DQS, PDy and PDz of FIG. 2. FIG. 2 shows, in the upper region, the time behavior of a DQS signal, which may be, for example, an output signal to be tested of the integrated circuit 11. A task of the arrangement is to test whether, in certain time windows, the test signal DQS is greater or less than a predetermined reference voltage value.

The reference signal PDy serves for switching the comparator device 14 for testing the HIGH signal state of the test signal DQS in "sharp" or "critical" fashion. For this purpose, in the time window in which the DQS signal must have a high voltage potential, the reference signal PDy is put from a very small potential to a minimum value for the high voltage potential. If the test signal DQS is greater than said minimum value in said time window, the signal comparison is positive and an error signal is not output (cf. FIG. 2, central region). However, if the test signal DQS is less than the minimum value, the signal comparison turns out to be negative and an error signal is output by the comparator device 14 into a first error memory device 26 and stored there. Outside the time window, i.e. when the reference signal PDy has a small potential, the signal present at the test signal input 22 will always be greater than the reference signal PDy, so that the comparator device 14 does not generate and output an error.

In a similar manner, the reference signal PDz serves for prescribing the maximum value of the voltage potential which the test signal DQS is permitted to have in a time window in which a low voltage potential (LOW) is expected for DQS. The second comparator device 16 is accordingly switched in "critical" fashion by the reference signal PDz being set from a very high voltage potential to the maximum value for the low voltage potential (LOW). If the test signal DQS has an excessively large voltage potential in this time window, then an error state is generated and stored in a second error memory device 28. The error memory devices 26 and 28 can preferably be erased by a slow and binary RESET signal from the test system 10.

After a predetermined test duration (a predetermined number of DQS pulses), the error memory devices 26 and 28 are read by the test system 10. For this purpose, the circuit apparatus 12 has two error memory selection devices 30, 32 assigned to the error memory devices 26 and 28, respectively. The error memory selection devices 30, 32 respectively have an error memory selection input 34, 36, which can be switched by a preferably slow, binary signal from the test system 10. Consequently, the error state of the error memory devices 26, 28 can be determined by read-out at the error signal output 38, connected to the test result input (not illustrated) of the test system 10.

The driver output PDx of the test system 10 is used in order to test or to calibrate the arrangement and to generate the DQS signal during writing. The test signal DQS can be simulated by the PDx signal of the test system 10, so that the circuit apparatus can be tested with a test signal whose time and level behavior is known precisely. Calibration is effected by the reference signals PDy and PDz being adapted with regard to level and "timing".

The arrangement can advantageously be extended in a simple manner to test a multiplicity of test signals DQS. By way of example, if 18 DQS signals are to be tested by the arrangement, it is possible to provide 18 comparator device pairs in the circuit apparatus. 18 PDx driver outputs of the test system 10 are connected separately to the 18 DQS test signals. The reference signals PDy and PDz may advantageously be identical for all the test signals DQS. As already described above, the error evaluation can be effected separately for each test signal DQS (DQS-fine evaluation) or overall for the DUT (DUT-fine evaluation).

What is claimed is:

1. A test circuit br testing an integrated circuit, the test circuit comprising:
   a test signal input for receiving a test signal from the integrated circuit;
   a first reference signal input for receiving a first reference signal;
   a first comparator in communication with the test signal input and with the first reference signal input, the first comparator configured to output a first error signal only when a test signal voltage of the test signal exceeds a reference signal voltage of the first reference signal;
   a second reference signal input for receiving a second reference signal, and
   a second comparator in communication with the test signal input and with the second reference signal input, the second comparator being configured to provide, at a second comparator output, a second error signal only when a reference signal voltage of the second reference signal exceeds the test signal voltage;
   a first error memory, in communication with the first comparator output, for storing the first error signal; and
   an error signal output in communication with the first error memory.

2. The test circuit of claim 1, wherein the first comparator is configured to output a binary error signal in response to a comparison of voltages of the test signal and the first reference signal.

3. The test circuit of claim 1, wherein the first error memory comprises a flip-flop.

4. The test circuit of claim 1, further comprising a reset signal input connected to the error first memory for erasing an error state thereof.

5. The test circuit of claim 1, further comprising a second error memory in communication with the second comparator output for storing the second error signal, the second error memory being in communication with the error signal output.

6. The test circuit of claim 5, wherein the first error memory and the second error memory are configured to be read separately from each other at the error signal output.

7. A system for testing an integrated circuit, the system comprising:
- a test circuit including:
  - a test signal input for receiving a test signal from the integrated circuit;
  - a first reference signal input for receiving a first reference signal;
  - a first comparator in communication with the test signal input and with the first reference signal input, the first comparator configured to output a first error signal only when a test signal voltage of the test signal exceeds a reference signal voltage of the first reference signal;
  - a second reference signal input for receiving a second reference signal, and
  - a second comparator in communication with the test signal input and with the second reference signal input, the second comparator being configured to provide, at a second comparator output, a second error signal only when a reference signal voltage of the second reference signal exceeds the test signal voltage;
  - a first error memory, in communication with the first comparator output, for storing the first error signal; and
  - an error signal output in communication with the first error memory;
  - a programmable driver output for outputting the first reference signal to the first reference signal input of the test circuit, and
  - a test result input in communication with the error signal output for receiving the first error signal.

8. The system of claim 7, wherein the test circuit comprises an ASIC ("application specific integrated circuit").

9. The system of claim 7, wherein the test circuit comprises a programmable logic array.

10. The system of claim 7, wherein the programmable driver output comprises an analog high-speed output.

11. The system of claim 10, wherein the test result input is a low speed input.

12. The system of claim 7, further comprising a second programmable driver output in communication with the test signal input.

13. The system of claim 12, wherein the second programmable driver output forms an active termination of the test signal input.

14. A system for testing an integrated circuit, the system comprising:
- a test circuit including:
  - a test signal input for receiving a test signal from the integrated circuit;
  - a first reference signal input for receiving a first reference signal;
  - a first comparator in communication with the test signal input and with the first reference signal input, the first comparator configured to output a first error signal only when a test signal voltage of the test signal exceeds a reference signal voltage of the first reference signal;
  - a second reference signal input for receiving a second reference signal, and
  - a second comparator in communication with the test signal input and with the second reference signal input, the second comparator being configured to provide, at a second comparator output, a second error signal only when a reference signal voltage of the second reference signal exceeds the test signal voltage;
  - a first error memory, in communication with the first comparator output, for storing the first error signal; and
  - an error signal output in communication with the first error memory;
  - a first programmable driver output for outputting the first reference signal to the first reference signal input of the test circuit,
  - a second programmable driver output for outputting the second reference signal to the second reference signal input, and
  - a test result input in communication with the error signal output for receiving the error signal.

15. A method of testing a test signal of a DDR-DIMM, the method comprising:
- providing a system, and
- providing the test signal to the system, the system including:
  - a test signal input for receiving a test signal from the integrated circuit;
  - a first reference signal input for receiving a first reference signal;
  - a first comparator in communication with the test signal input and with the first reference signal input, the first comparator configured to output a first error signal only when a test signal voltage of the test signal exceeds a reference signal voltage of the first reference signal;
  - a second reference signal input for receiving a second reference signal, and
  - a second comparator in communication with the test signal input and with the second reference signal input, the second comparator being configured to provide, at a second comparator output, a second error signal only when a reference signal voltage of the second reference signal exceeds the test signal voltage;
  - a first error memory, in communication with the first comparator output, for storing the first error signal; and
  - an error signal output in communication with the first error memory;
  - a programmable driver output for outputting the first reference signal to the first reference signal input of the test circuit, and
  - a test result input in communication with the error signal output for receiving the first error signal.

16. A method of testing a test signal generated by an integrated circuit, the method comprising:
- providing the test signal to a test signal input of a test circuit;
- providing a reference signal into a reference signal input of the test circuit;
- comparing the test signal and the reference signal with a comparator;
- storing an error signal into an error memory only when a test signal voltage of the test signal exceeds a reference signal voltage of the reference signal; and
- reading the error signal from the error memory.

17. The method of claim 16, wherein comparing the test signal comprises providing an external control signal to the comparator for causing the comparator to enter a comparison mode.

* * * * *